(12) United States Patent
Li

(10) Patent No.: US 12,040,356 B2
(45) Date of Patent: Jul. 16, 2024

(54) FIN-SHAPED SEMICONDUCTOR DEVICE, FABRICATION METHOD, AND APPLICATION THEREOF

(71) Applicant: GUANGDONG ZHINENG TECHNOLOGY CO., LTD., Guangdong (CN)

(72) Inventor: Zilan Li, Guangzhou (CN)

(73) Assignee: GUANGDONG ZHINENG TECHNOLOGY CO., LTD., Guangdong (CN)

(*) Notice: Subject to any disclaimer, the term of this patent is extended or adjusted under 35 U.S.C. 154(b) by 37 days.

(21) Appl. No.: 17/603,541

(22) PCT Filed: Mar. 3, 2021

(86) PCT No.: PCT/CN2021/078957
§ 371 (c)(1),
(2) Date: Oct. 13, 2021

(87) PCT Pub. No.: WO2021/208623
PCT Pub. Date: Oct. 21, 2021

(65) Prior Publication Data
US 2023/0031161 A1 Feb. 2, 2023
US 2023/0268381 A2 Aug. 24, 2023

(30) Foreign Application Priority Data
Apr. 13, 2020 (CN) .......................... 202010288959.5

(51) Int. Cl.
*H01L 29/04* (2006.01)
*H01L 21/8252* (2006.01)
(Continued)

(52) U.S. Cl.
CPC ........ *H01L 29/045* (2013.01); *H01L 21/8252* (2013.01); *H01L 27/0922* (2013.01);
(Continued)

(58) Field of Classification Search
CPC ............ H01L 21/8252; H01L 27/0922; H01L 29/045; H01L 29/66462; H01L 29/7786; H01L 29/7787; H01L 29/7788
See application file for complete search history.

(56) References Cited

U.S. PATENT DOCUMENTS

2013/0277683 A1  10/2013  Then et al.
2014/0084299 A1  3/2014   Schelling et al.
(Continued)

FOREIGN PATENT DOCUMENTS

CN  110024130 A1  7/2019
CN  110224019 A  *  9/2019  ........... H01L 27/085
(Continued)

OTHER PUBLICATIONS

International Search Report and Written Opinion for PCT/CN2021/078957 issued May 21, 2021, 11 total pages.
(Continued)

*Primary Examiner* — Brook Kebede
(74) *Attorney, Agent, or Firm* — Casimir Jones SC; Tyler Sisk

(57) ABSTRACT

A semiconductor device and a method of fabricating the same are proposed. The semiconductor device includes a plurality of hole-channel Group III nitride devices and a plurality of electron-channel Group III nitride devices. In the above, the hole-channel Group III nitride devices and the electron-channel Group III nitride devices are arranged in correspondence with each other. The electron-channel Group III nitride device has a fin-shaped channel, and a two-dimensional hole gas and/or a two-dimensional electron gas can be simultaneously formed at an interface between a compound semiconductor layer and a nitride semiconductor layer.

15 Claims, 14 Drawing Sheets

(51) Int. Cl.
*H01L 27/092* (2006.01)
*H01L 29/66* (2006.01)
*H01L 29/778* (2006.01)

(52) U.S. Cl.
CPC .... *H01L 29/66462* (2013.01); *H01L 29/7787* (2013.01); *H01L 29/7788* (2013.01)

(56) References Cited

U.S. PATENT DOCUMENTS

| | | | |
|---|---|---|---|
| 2014/0170998 | A1 | 6/2014 | Then et al. |
| 2017/0200820 | A1 | 7/2017 | Conway et al. |
| 2017/0222047 | A1 | 8/2017 | Conway et al. |
| 2019/0165153 | A1* | 5/2019 | Wu ............... H01L 29/1029 |
| 2019/0267454 | A1* | 8/2019 | Matioli .......... H01L 29/2003 |
| 2020/0105760 | A1* | 4/2020 | Passlack ........ H01L 29/66462 |
| 2020/0328297 | A1 | 10/2020 | Li |

FOREIGN PATENT DOCUMENTS

| | | |
|---|---|---|
| CN | 110224019 A1 | 9/2019 |
| CN | 110400848 A1 | 11/2019 |
| CN | 111816702 A1 | 10/2020 |
| CN | 111816706 A1 | 10/2020 |
| EP | 2765611 A2 | 8/2014 |

OTHER PUBLICATIONS

European Patent Office, Office Action for EP Application No. 21786076.6; date: Aug. 8, 2022.
Japan Patent Office, Notification of Refusal for JP Application No. 2022-560180; date: Sep. 5, 2023.
European Patent Office, Supplementary European Search Report for EP Application No. 21786076.6; date: Jul. 27, 2022.
China Patent Office, First Search of CN Application No. CN2020102889595;.
China Patent Office, First Office Action of CN Application No. CN2020102889595; date: Jul. 22, 2023.
Korea Patent Office, First Office Action of KR No. KR10-2022-7034663; date: Oct. 5, 2022.
Japan Patent Office, Decision to Grant a Patent for JP Application No. 2022-560180; date: Feb. 6, 2024.

* cited by examiner

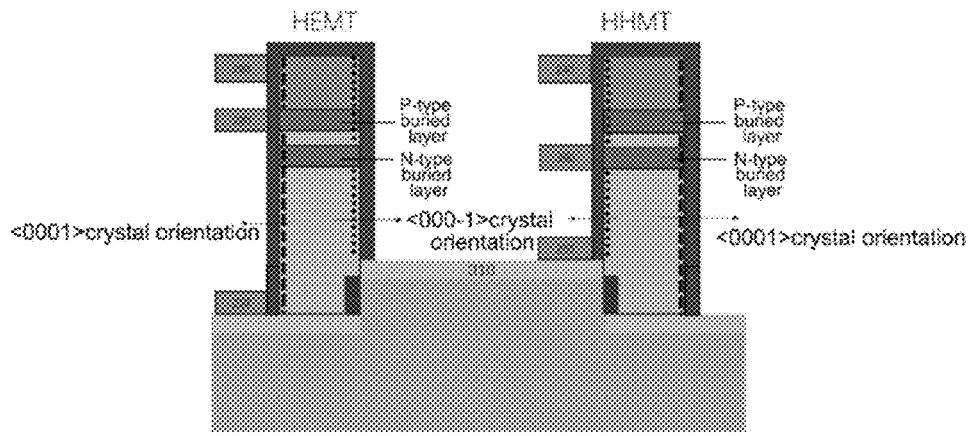

Fig. 36

```
providing a substrate and etching a stepped structure
on an upper surface thereof, wherein the stepped
structure has a first plane and a second plane, which
are substantially parallel to each other, and a third
surface respectively connecting the first plane and
the second plane, and the third surface includes
a crystalline lattice of a hexagonal symmetry
```

```
laterally epitaxially growing a fin-shaped nitride
semiconductor layer upwardly using the third surface
as a core, being limited by the second plane,
and being perpendicular to the second plane
```

```
forming a first compound semiconductor layer (130)
on the nitride semiconductor layer, so as to
simultaneously form, at an interface between the
first compound semiconductor layer (130) and the
nitride semiconductor layer, a two-dimensional
hole gas and immovable background negative
charges; and/or a two-dimensional electron
gas and immovable background positive charges
```

Fig. 37

FIN-SHAPED SEMICONDUCTOR DEVICE, FABRICATION METHOD, AND APPLICATION THEREOF

CROSS-REFERENCE TO RELATED APPLICATIONS

This application is a 35 U.S.C § 371 national stage application of International Application No. PCT/CN2021/078957, filed on Mar. 3, 2021, entitled "FIN-SHAPED SEMICONDUCTOR DEVICE, FABRICATION METHOD, AND APPLICATION THEREOF", which application claims the benefit of priority to Chinese Patent Application No. 202010288959.5 filed Apr. 13, 2020, the disclosures and contents of all of which are hereby incorporated by reference in their entireties.

TECHNICAL FIELD

The present disclosure relates to the field of semiconductors, and in particular to a fin-shaped semiconductor device, a fabrication method, and an application thereof.

BACKGROUND

Group III nitride semiconductors belong to a kind of important novel semiconductor materials, mainly including: AlN, GaN, InN and compounds of such materials such as AlGaN, InGaN, AlInGaN and the like. By utilizing advantages of Group III nitride semiconductors, e.g. direct band gap, wide forbidden band, high breakdown electric field intensity, through optimized designs of device structure and process, Group III nitride semiconductors have broad prospects in fields of power semiconductors and wireless communication.

In addition, in regard to structural design, existing semiconductor devices are mainly lateral devices, thus, the integration level per unit area is not high enough. Moreover, existing Group III nitride semiconductor devices are normally-open devices, that is to say, the devices are in a conducting state, when the third electrode is not biased. However, in many applications, semiconductor devices must be normally-closed devices, and these normally-open devices are also disadvantageous for energy saving.

SUMMARY

In view of the above situations, a novel fin-shaped semiconductor device structure and a method of fabricating the same are proposed in the present disclosure.

A brief description of the present disclosure will be made below to provide basic understanding regarding certain aspects of the present disclosure. It should be understood that this brief description is not intended to exhaustively describe the present disclosure in brief. It is neither intended to determine key or important parts of the present disclosure, nor intended to limit the scope of the present disclosure. Its purpose is merely to provide some concepts in a simplified form, and use this as a preamble for more detailed description in latter discussion.

According to an aspect of the present disclosure, a method of fabricating a fin-shaped electron-channel semiconductor device is proposed, comprising:

providing a substrate and etching a stepped structure on an upper surface thereof, wherein the stepped structure has a first plane and a second plane, which are substantially parallel to each other, and a third surface respectively connecting the first plane and the second plane, and the third surface includes a crystalline lattice of a hexagonal symmetry;

laterally epitaxially growing a fin-shaped nitride semiconductor layer upwardly using the third surface as a core, being limited by the second plane, and being perpendicular to the second plane; and forming a first compound semiconductor layer (130) on the nitride semiconductor layer, so as to simultaneously form, at an interface between the first compound semiconductor layer (130) and the nitride semiconductor layer, a two-dimensional hole gas and immovable background negative charges; and/or a two-dimensional electron gas and immovable background positive charges.

Optionally, the substrate is selected from $Al_2O_3$, 4H—SiC, silicon of a (110) face, or silicon of a (112) face.

Optionally, the third surface is selected from a (0001) face of $Al_2O_3$, a (0001) face of 4H—SiC, and a (111) face of silicon.

Optionally, a first insulating layer is formed on other surfaces of the substrate except the third surface.

Optionally, a method of forming the first insulating layer comprises: depositing SiN on the substrate in a coplanar manner; only reserving the SiN on the third surface by an etching technique of a vertical orientation; then forming a silicon dioxide layer on other surfaces except the third surface; and then removing the SiN on the sidewall by wet etching, while reserving the silicon dioxide layer on the other surfaces.

Optionally, it further comprises: forming a seed layer on the third surface, wherein the seed layer is formed on partial surface of the third surface; or the seed layer is formed on the entire surface of the third surface.

Optionally, a polycrystalline or amorphous layer formed by the seed layer material is removed from or reserved on the first insulating layer.

Optionally, the seed layer must be present, when the substrate is a silicon substrate.

Optionally, it further comprises: laterally epitaxially growing a buffer layer with the seed layer serving as a core.

Optionally, it further comprises: laterally epitaxially growing a first nitride semiconductor layer (110) with the seed layer or the buffer layer serving as a core.

Optionally, it further comprises: laterally epitaxially growing a P-type buried layer with the first nitride semiconductor layer (110) serving as a core.

Optionally, the buried layer can exhaust 95-100% of the two-dimensional electron gas.

Optionally, the device can be protected by constituting a body diode from the P-type buried layer and the two-dimensional electron gas.

Optionally, it further comprises: continuing to laterally epitaxially grow a second nitride semiconductor layer (120) with the first nitride semiconductor layer (110) or the buried layer serving as a core.

Optionally, the first nitride semiconductor layer (110) and the second nitride semiconductor layer (120) are made of same or different materials.

Optionally, the first nitride semiconductor layer (110) is made of N-type GaN or P-type GaN, and the second nitride semiconductor layer (120) is made of intrinsic GaN or N-type GaN.

Optionally, it further comprises: exposing a (0001) face of a first trench layer; or simultaneously exposing (0001) and (0001⁻) faces of the first nitride semiconductor layer.

Optionally, it further comprises: removing the first compound semiconductor layer covering in a <0001⁻> direction of the first nitride semiconductor layer.

Optionally, a fourth insulating layer is formed in the <0001⁻> direction of the first nitride semiconductor layer.

Optionally, when the second nitride semiconductor layer is made of N-type GaN, the P-type buried layer and the second nitride semiconductor layer form a PN structure.

Optionally, it further comprises: forming a second compound semiconductor layer (160) through deposition, before depositing the first compound semiconductor layer (130).

Optionally, the second compound semiconductor layer (160) is made of unintendedly doped or intrinsic GaN; or the compound semiconductor layer 160 is selected from AlN, InGaN, AlInN, or AlInGaN.

Optionally, it further comprises: forming a first electrode, a second electrode, and a third electrode of the device.

Optionally, the first electrode and the second electrode are in physical contact with the nitride semiconductor layer of the device, and are in ohmic contact with the two-dimensional electron gas; or the first electrode and the second electrode are in physical contact with the compound semiconductor layer, forming an ohmic contact.

Optionally, the third electrode and the first compound semiconductor layer form a Schottky contact or form an insulating contact.

Optionally, the insulating contact indicates forming a gate dielectric layer at a portion on the first compound semiconductor layer corresponding to the third electrode.

Optionally, a method of forming the gate dielectric layer is as follows: online in-situ growing the gate dielectric layer, after forming the first compound semiconductor layer (130) through an MOCVD method; or separately growing the gate dielectric layer in a growing apparatus differing from that for growing the first compound semiconductor layer (130).

Optionally, the first electrode, the third electrode, and the second electrode are successively arranged in a direction substantially perpendicular to the first plane of the substrate, and the positions of the first electrode and the second electrode are exchangeable.

Optionally, it further comprises: forming a body electrode in connection with the buried layer.

Optionally, the body electrode is formed through a physical contact with the buried layer.

Optionally, the body electrode is formed through an ohmic contact with the two-dimensional hole gas, and then the body electrode is enabled to be in electric connection with the buried layer through the two-dimensional hole gas.

Optionally, the body electrode enables all or partial two-dimensional hole gas between the second electrode and the third electrode to be exhausted, when the device is shut down, such that only the background negative charges are left, and the exhausted in case of a shut-down device counteracts the electric field generated by the background positive charges, so that the electric field is distributed more evenly.

Optionally, a method of forming the second electrode further comprises: forming a first metal layer on the first plane of the substrate, and removing the first metal layer slightly deposited on a (0001) face of the first compound semiconductor layer of the device through isotropic etching.

Optionally, a method of forming a gate further comprises: forming a second insulating layer on the first metal layer through coplanar deposition, wherein the compound semiconductor layer 130 or the gate dielectric layer are exposed from the second insulating layer, then forming a second metal layer on the second insulating layer, and removing the second metal layer slightly deposited on the (0001) face of the first compound semiconductor layer of the device through isotropic etching.

Optionally, a method of forming the first electrode further comprises: forming a third insulating layer on the second metal layer through coplanar deposition, then forming a third metal layer on the third insulating layer, and then forming the first electrode through photoetching etching.

According to another aspect of the present disclosure, a fin-shaped electron-channel semiconductor device is proposed, comprising:

a substrate, on which a stepped structure is formed, wherein the stepped structure has a first plane and a second plane, which are substantially parallel to each other, and a third surface respectively connecting the first plane and the second plane, wherein the third surface includes a crystalline lattice of a hexagonal symmetry;

a fin-shaped nitride semiconductor layer, which is laterally epitaxially grown upwardly using the third surface as a core, limited by the second plane, and perpendicular to the second plane; and a first compound semiconductor layer (130) formed on the nitride semiconductor layer, so as to simultaneously form a two-dimensional electron gas and/or a two-dimensional hole gas at an interface between the first compound semiconductor layer and the nitride semiconductor layer.

Optionally, the substrate is selected from $Al_2O_3$, intrinsic GaN, 4H—SiC, silicon of a (110) face, or silicon of a (112) face.

Optionally, the nitride semiconductor layer comprises a first nitride semiconductor layer and a second nitride semiconductor layer.

Optionally, the third surface is selected from a (0001) face of $Al_2O_3$, a (0001) face of 4H—SiC, and a (111) face of silicon.

Optionally, a first insulating layer is provided on other surfaces of the substrate except the third surface.

Optionally, a seed layer is provided on the third surface of the substrate.

Optionally, a polycrystalline or amorphous layer formed by the seed layer material is provided on the first insulating layer.

Optionally, a buffer layer being in a single-layer or multilayer structure is further provided on the outside of the seed layer.

Optionally, the first nitride semiconductor layer (110) is provided on the outside of the seed layer.

Optionally, the first nitride semiconductor layer (110) is provided on the outside of the buffer layer.

Optionally, a P-type buried layer is provided on the nitride semiconductor layer 110, and a body diode structure is formed from the P-type buried layer and the two-dimensional electron gas.

Optionally, the second nitride semiconductor layer is formed on the first nitride semiconductor layer or the buried layer.

Optionally, the first nitride semiconductor layer and the second nitride semiconductor layer are made of same or different materials.

Optionally, the first nitride semiconductor layer is made of N-type or P-type GaN, and the second nitride semiconductor layer is made of intrinsic GaN or N-type GaN.

Optionally, a second compound semiconductor layer (160) is further provided, and the second compound semiconductor layer (160) is made of unintendedly doped GaN, InGaN, AlN, or AlInGaN.

Optionally, the first compound semiconductor layer is not present in a <0001⁻> direction of the first nitride semiconductor layer.

Optionally, a fourth insulating layer is provided in a <0001> direction of the first nitride semiconductor layer.

Optionally, the second nitride semiconductor layer and the buried layer form a body diode structure, when the second nitride semiconductor layer is made of N-type GaN.

Optionally, a first electrode, a second electrode, and a third electrode are further provided.

Optionally, the first electrode/the second electrode is in physical contact with the nitride semiconductor layer of the device, and is in ohmic contact with the two-dimensional electron gas; or the first electrode/the second electrode is in physical contact with the first compound semiconductor layer, forming an ohmic contact.

Optionally, the third electrode and the first compound semiconductor layer form a Schottky contact or form an insulating contact.

Optionally, the insulating contact indicates providing a gate dielectric layer between the third electrode and the compound semiconductor layer 130.

Optionally, the first electrode, the third electrode, and the second electrode are successively arranged in a direction substantially perpendicular to the first plane of the substrate; and the positions of the first electrode and the second electrode are exchangeable.

Optionally, a body electrode is further provided, wherein the body electrode is in electric connection with the buried layer, and through the arrangement of the body electrode, the body diode formed by the buried layer and the two-dimensional electron gas is enabled to conduct a current opposite to the current direction of a transistor channel, while a threshold voltage is stabilized; or through the connection of the body electrode, an electric circuit application of the body diode formed by the buried layer and the second nitride semiconductor layer composed of N-type GaN is realized.

Optionally, the body electrode is in physical connection with the buried layer, or the body electrode is in ohmic contact through the two-dimensional hole gas.

Optionally, the region in the first nitride semiconductor layer (110) corresponding to the second electrode is N-type doped, and the region in the second nitride semiconductor layer (120) corresponding to the first electrode is N-type doped.

According to another aspect of the present disclosure, a fin-shaped electron-channel semiconductor device is proposed, comprising:
a substrate,
a fin-shaped nitride semiconductor layer epitaxially grown perpendicular to an upper surface the substrate, wherein the nitride semiconductor layer comprises a first nitride semiconductor layer and a second nitride semiconductor layer; and
a first compound semiconductor layer (130) formed on the nitride semiconductor layer, so as to simultaneously form a two-dimensional hole gas and/or a two-dimensional electron gas at an interface between the first compound semiconductor layer (130) and the nitride semiconductor layer.

Optionally, the substrate is selected from $Al_2O_3$, intrinsic GaN, 4H—SiC, silicon of a (110) face, or silicon of a (112) face.

Optionally, a first insulating layer is provided on the upper surface of the substrate.

Optionally, a seed layer is provided on the substrate.

Optionally, a buffer layer being in a single-layer or multilayer structure is further provided on the outside of the seed layer.

Optionally, the first nitride semiconductor layer and the second nitride semiconductor layer are arranged on top of one another in a manner of being parallel to the upper surface of the substrate.

Optionally, a P-type buried layer is sandwiched between the first nitride semiconductor layer and the second nitride semiconductor layer.

Optionally, a body diode structure is formed from the P-type buried layer and the two-dimensional electron gas.

Optionally, the first nitride semiconductor layer and the second nitride semiconductor layer are made of same or different materials.

Optionally, the first nitride semiconductor layer is made of N-type or P-type GaN, and the second nitride semiconductor layer is made of intrinsic GaN or N-type GaN.

Optionally, a second compound semiconductor layer (160) is further provided, and the second compound semiconductor layer (160) is made of unintendedly doped GaN, InGaN, AlN, or AlInGaN.

Optionally, the first compound semiconductor layer is not present in a <000-1> direction of the first nitride semiconductor layer.

Optionally, a fourth insulating layer is provided in the <000-1> direction of the first nitride semiconductor layer.

Optionally, the second nitride semiconductor layer and the buried layer form a body diode structure, when the second nitride semiconductor layer is made of N-type GaN.

Optionally, a first electrode, a second electrode, and a third electrode are further provided.

Optionally, the first electrode/the second electrode is in physical contact with the nitride semiconductor layer of the device, and is in ohmic contact with the two-dimensional electron gas; or the first electrode/the second electrode is in physical contact with the first compound semiconductor layer, forming an ohmic contact.

Optionally, the third electrode and the first compound semiconductor layer form a Schottky contact or form an insulating contact.

Optionally, the insulating contact indicates providing a gate dielectric layer between the third electrode and the first compound semiconductor layer.

Optionally, the first electrode, the third electrode, and the second electrode are successively arranged in a direction substantially perpendicular to the first plane of the substrate; and the positions of the first electrode and the second electrode are exchangeable.

Optionally, a body electrode is further provided, and the body electrode is in electric connection with the buried layer.

Optionally, the body electrode is in physical connection with the buried layer, or the body electrode is in ohmic contact through the two-dimensional hole gas.

According to another aspect of the present disclosure, a fin-shaped complementary semiconductor device is proposed, comprising:
an electron-channel semiconductor device as described above, and a plurality of hole-channel semiconductor devices, wherein the hole-channel semiconductor device is arranged opposite to the electron-channel semiconductor device in structure.

Optionally, the hole-channel device has a fourth electrode, a fifth electrode, and a sixth electrode.

Optionally, the hole-channel device having formed fourth to sixth electrodes and the electron-channel semiconductor device can be arranged symmetrically.

Optionally, the hole-channel device has an N-type buried layer at a portion of the first nitride semiconductor layer corresponding to the sixth electrode.

Optionally, the hole-channel device is P-type doped at corresponding portions of the nitride semiconductor layer corresponding to the fourth and fifth electrodes.

Optionally, an N-type buried layer and a P-type buried layer are simultaneously provided in the hole-channel device and in the electron-channel device.

According to another aspect of the present disclosure, a radiofrequency device is proposed, which comprises any one of devices as described above.

According to another aspect of the present disclosure, an electric power device is proposed, which comprises any one of devices as described above.

BRIEF DESCRIPTION OF THE DRAWINGS

Specific contents of the present disclosure will be described below referring to the accompanying drawings, which will be contributive to easier understanding of the above and other objects, features, and advantages of the present disclosure. The drawings are only to illustrate the principles of the present disclosure. In the drawings, it is not necessary to proportionally draw the size and relative positions of the units. In the drawings:

FIGS. 35-36 are schematic diagrams of an optional semiconductor device structure and a method of fabricating the same; and FIG. 37 is a schematic diagram of an optional method of fabricating a semiconductor device.

DETAILED DESCRIPTION OF THE EMBODIMENTS

Exemplarily disclosed contents of the present disclosure will be described below with reference to the accompanying drawings. For the sake of clarity and conciseness, not all features realizing the present disclosure are depicted in the description. However, it should be understood that many modes capable of carrying out the present disclosure can be made during the implementation of the present disclosure, so as to achieve specific objects of developers, and these modes may vary according to different contents of the present disclosure.

Here, it shall further be clarified that in order to avoid complicating the present disclosure due to unnecessary details, only device structures closely relating to solutions according to the present disclosure are shown in the accompanying drawings, while some details are omitted.

It should be understood that the present disclosure is not limited to the described embodiments because of following depiction made with reference to the accompanying drawings. In the present disclosure, if feasible, features of difference embodiments may be replaced or borrowed, and one or more features may be omitted in one embodiment.

In the following specific embodiments, reference can be made to the accompanying drawings, which show partial contents of the present disclosure and show exemplary embodiments. In addition, it should be understood that other embodiments may be utilized and structural and/or logical changes may be made, without departing from the scope of the subject matter for which protection is sought. It should also be pointed out that orientations and positions (e.g. upper, lower, top, bottom or the like) are merely used to help the description of features in the accompanying drawings, rather than indicating that following specific embodiments are only adopted in a limiting sense.

As for terminologies used in the description and in the appended claims of the present disclosure, unless otherwise explicitly indicated in the context, plural forms are also included by terms "a", "one", and "the". It would also be understandable that the terminology "and/or" as used herein refers to and comprises any and all possible combinations of one or more associated listed items.

Group III nitride semiconductors mainly have two kinds of crystal structures, i.e., wurtzite and zinc-blende. Since wurtzite has advantages of stability and ease of obtaining a higher crystal quality, Group III nitride semiconductors practically applied usually have a wurtzite structure.

Thus, the semiconductor device structure of the present disclosure specifically includes Group III nitride devices using the wurtzite crystal structure. Optionally, the Group III nitride devices are normally-closed nitride semiconductor devices.

Figure 1:
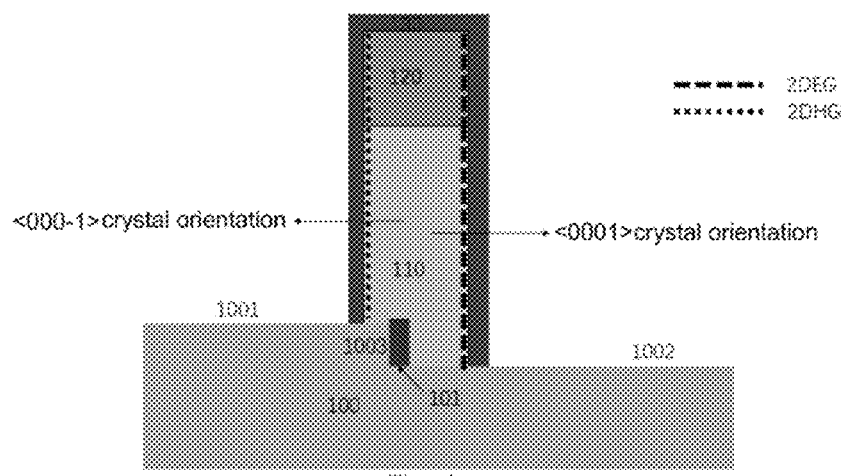
FIGS. 1-12 are schematic diagrams according to a semiconductor device structure and a method of fabricating the same.
Figure 2:
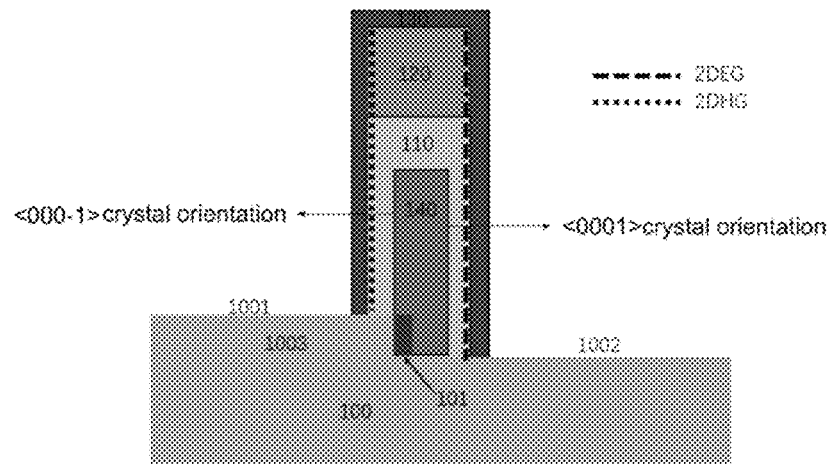
Figure 3:
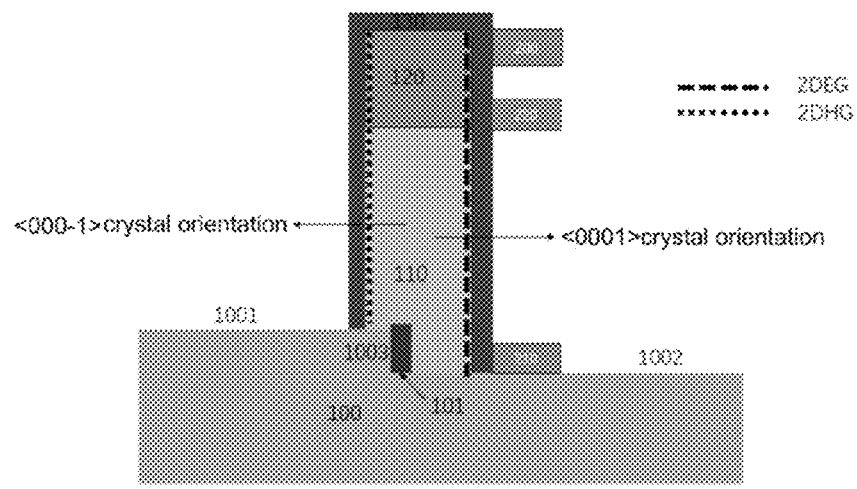

As shown in FIGS. 1-3, in this embodiment, a semiconductor device comprises a substrate 100, for which a separate substrate or a blocky gallium nitride material can be employed, and since the preparation of a gallium nitride material is very expensive, a feasible method is epitaxially growing a gallium nitride semiconductor layer on a foreign substrate and producing a device. As foreign substrate material, sapphire ($Al_2O_3$), Si, and SiC or the like can be selected. In the above, a (0001) face of sapphire, a (0001) face of SiC, a (111) face of Si and the like all include a crystalline lattice structure of a hexagonal symmetry and are suitable for use as substrate for heterogeneous growth, and the nucleation and growth of a gallium nitride semiconductor layer thereon is advantageous to obtain GaN or AlN crystals of a higher quality.

Moreover, because of its low costs and good crystalline lattice match between a gallium nitride epitaxial layer and a sapphire substrate, the sapphire substrate is widely applied. Considering heat dissipation, it is more and more popular to prepare a gallium nitride semiconductor layer using a silicon substrate; however, problems of leakage current and withstand voltage should be considered in the case of the use of a silicon substrate. During the technological process according to the present disclosure, this is carefully designed, so as to avoid influences on the device performance caused by the silicon substrate material, which is significantly contributive to the increase of the withstand voltage and the reduction of dark current.

In summary, the material of the foreign substrate can be selected according to practical requirements, no limitation regarding the specific material of the substrate is made in the present disclosure, as long as the substrate material meets the requirement that a vertical trench formed on a surface thereof in a manner of being perpendicular to the surface thereof has a lateral surface having a crystalline lattice structure of a hexagonal symmetry. In the present disclosure, the substrate material may be sapphire ($Al_2O_3$), SiC, silicon, and a separate or blocky intrinsic gallium nitride material or the like.

In the present disclosure, as shown in FIG. 1, the substrate 100 comprises a first plane 1001, and a structure including a third surface perpendicular to the first plane in the substrate is formed on the substrate 100 through etching. Exemplarily, the structure may be a stepped structure, which is composed of the first plane 1001 of the substrate 100, a second plane 1002 parallel to the first plane, and the third surface 1003 respectively connecting the first plane 1001 and the second plane 1002, wherein the third surface has a hexagonal symmetry. Exemplarily, the stepped height difference is about 5 microns.

A seed layer 101 is formed on the third surface, and the seed layer 101 can be formed on partial surface of the third surface or formed on the entire surface of the third surface. As for the silicon material, e.g. a semiconductor layer of gallium nitride cannot be directly grown on the substrate, due to the influence of the melt-back effect of Ga atoms, and it is generally required to grow a structure of an AlN or gallium nitride seed layer on the substrate for further growing a gallium nitride epitaxial layer. In contrast, a gallium nitride layer can be directly nucleated and grown on $Al_2O_3$ (sapphire), SiC, or intrinsic GaN; however, regarding to the crystal quality control, a seed layer 101 can be introduced during the technological process.

With the seed layer 101 serving as a core, a nitride semiconductor layer 110 is grown upwardly laterally epitaxially in a manner of being limited by the second plane 1002 of the substrate 100 and being perpendicular to the second plane, and a nitride semiconductor layer 120 is then grown laterally epitaxially continuously. The nitride semiconductor layer 110 and the nitride semiconductor layer 120 can be made of same or different materials. Exemplarily, the nitride semiconductor layer 110 is an N-type doped GaN layer or a P-type doped GaN layer; the nitride semiconductor layer 120 is an intrinsic GaN layer or an N-type doped GaN layer. Exemplarily, the N-type or P-type doping concentration may be $1E17$-$1E20/cm^3$. It could be understood that it is also possible that no stepped structure is formed, while a seed layer and a nitride semiconductor layer are formed on an upper surface of the substrate 100, but the growth directionality should be satisfied.

Optionally, as shown in FIG. 2, a semiconductor layer 140 may further be provided between the seed layer 101 and the nitride semiconductor layer 110, the semiconductor layer serves as a buffer layer, the semiconductor layer may be in a single-layer or multilayer structure, and the material of the semiconductor layer may e.g. one or more from AlN, GaN, AlGaN, InGaN, AlInN, and AlGaInN.

Optionally, partial regions in the nitride semiconductor layer 110 and the nitride semiconductor layer 120 corresponding to the source/drain of the device in subsequent process are correspondingly subjected to N-type doping; and doping can effectively reduce the contact resistance in the source/drain regions, and the N-type doping may have a concentration of $1E17$-$1E20/cm^3$.

The nitride semiconductor layer 120 on both sides in the direction of a first surface covering the nitride semiconductor layer 110 is removed, hereby exposing the nitride semiconductor layer 110. A compound semiconductor layer 130, e.g. AlGaN, is formed on the nitride semiconductor layer 110 and the nitride semiconductor layer 120.

If a Group III nitride semiconductor is employed for the nitride semiconductor layer 110, the nitride semiconductor layer 120, and the compound semiconductor layer 130, fixed polarized charges exist on a surface of the polar semiconductor or at an interface between two different polar semiconductors, since Group III nitride semiconductors have polarity. The presence of these fixed polarized charges may attract movable holes and electrons, hereby forming a two-dimensional hole gas 2DHG and a two-dimensional electron gas 2DEG. The generation of the two-dimensional hole gas 2DHG and the two-dimensional electron gas 2DEG does not require an additional electric field, nor does it depend on a doping effect in the semiconductor, they are spontaneously generated; and since doping is not required, ion scattering effect that a two-dimensional carrier gas (the two-dimensional hole gas and the two-dimensional electron gas) is subjected to is greatly reduced, and thus the carrier mobility is high.

The nitride semiconductor layer 120 in <0001⁻> direction and a <0001> direction covering the nitride semiconductor layer 110 is removed, hereby exposing the nitride semiconductor layer 110. A compound semiconductor layer 130, e.g. AlGaN, is formed on the nitride semiconductor layer 110 and the nitride semiconductor layer 120. In this case, a two-dimensional hole gas 2DHG is formed in the nitride semiconductor layer 110 and the nitride semiconductor layer 120 in the <0001⁻> direction at an interface with the compound semiconductor layer 130, and a two-dimensional electron gas 2DEG is simultaneously formed in the nitride semiconductor layer 110 and the nitride semiconductor layer 120 in the <0001> direction at an interface with the compound semiconductor layer 130.

A first electrode 200, a second electrode 210, and a third electrode 220 of an HEMT device are formed. No specific limitation is made regarding the positions of the first electrode 200 to the third electrode 220, wherein the first electrode may be the source of the device, the second electrode may be the drain of the device, and the third electrode may be the gate of the electrode; and the first and second electrodes can be in physical contact with a channel layer (110/120) of the device, and in ohmic contact with the two-dimensional electron carrier gas (2DEG), or the first and second electrodes are directly in physical contact with the compound semiconductor layer 130 and form an ohmic contact. Moreover, an insulating contact or a Schottky contact can be formed on the compound semiconductor layer 130 between the third electrode 220 and the compound semiconductor layer 130. In the above, an insulating layer contact refers to the formation of a gate dielectric layer 300 between the third electrode and the compound semiconductor layer 130, and the gate dielectric layer may be formed by $SiO_2$, SiN, a high-K-dielectric material or the like. The gate dielectric layer 300 can achieve a surface passivation function on the compound semiconductor layer 130, which is advantageous for the reduction of the gate leakage current of the device and for the application of the device in the power electronic field.

When the gate is fabricated directly on the compound semiconductor layer 130, a relatively great gate leakage current would be generated; in this case, the compound semiconductor layer 130 also serves as a dielectric layer, while maintaining a sufficiently high forbidden band width, and a device fabricated in such a manner is mainly applied in the radiofrequency (RF) field.

Exemplarily, as shown in FIG. 3, the first electrode 200, the second electrode 210, and the third electrode 220 can be distributed in a direction perpendicular to the first plane of the substrate 100. In the above, the second electrode 210 is closer to the first plane 1001 of the substrate 100. It should be understood that the first electrode may also be closer to the first plane 1001 of the substrate 100.

Now, a fabrication method for fabricating a semiconductor device of this structure is described in detail with reference to FIGS. 4-12 and FIG. 37.

Figure 4:
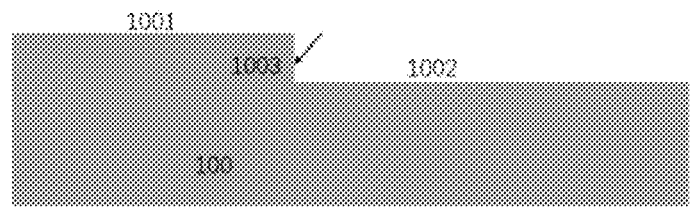

Step 1: as shown in FIG. 4, a substrate 100 is provided, photoetched pattern is formed on the substrate 100, and a stepped structure is then formed on its upper surface by etching, wherein the etching depth is exemplarily about 5 microns. The stepped structure is composed of a first plane 1001 of the substrate 100, a second plane 1002 parallel to the first plane 1001, and a third surface 1003 respectively connecting the first plane 1001 and the second plane 1002, wherein the third surface includes a crystalline lattice structure of a hexagonal symmetry. The third surface including a crystalline lattice structure of a hexagonal symmetry facilitates the nucleation and the growth of a nitride semiconductor, while other surfaces are disadvantageous for the nucleation and the growth of a nitride semiconductor.

Figure 5:
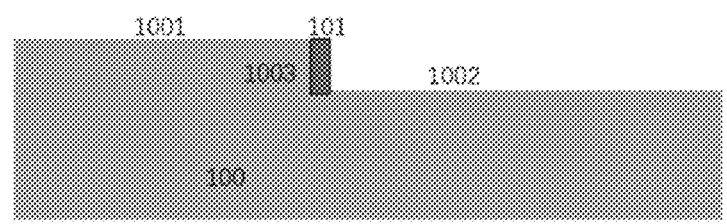

Step 2: as shown in FIG. 5, a seed layer 101 is formed on the third surface, and the seed layer 101 can be formed on partial surface of the third surface or formed on the entire surface of the third surface. The material of the seed layer is exemplarily e.g. GaN, AlN or the like.

As for the silicon material, GaN cannot be directly grown on the substrate, due to the influences of the melt-back effect of Ga atoms, and it is generally required to grow a structure of e.g. a seed layer on the substrate for further growing a GaN epitaxial layer.

Figure 6:
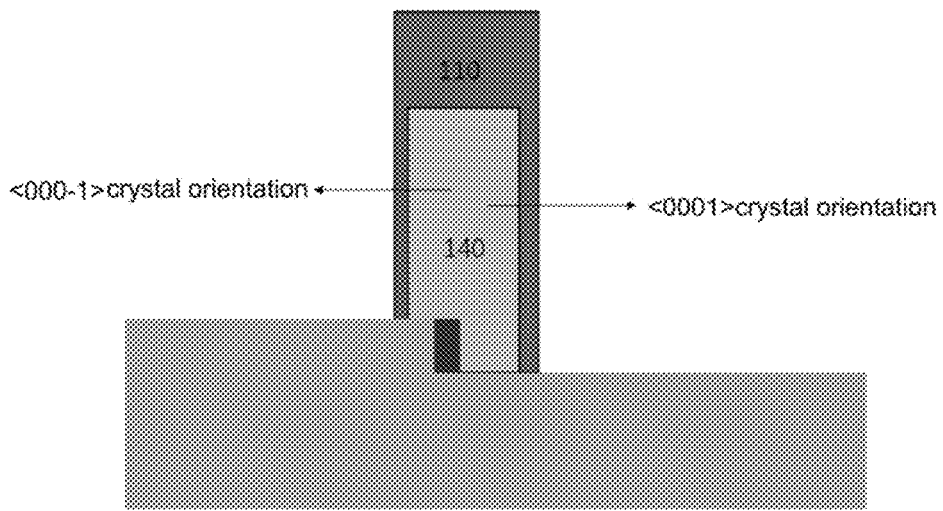
Figure 7:
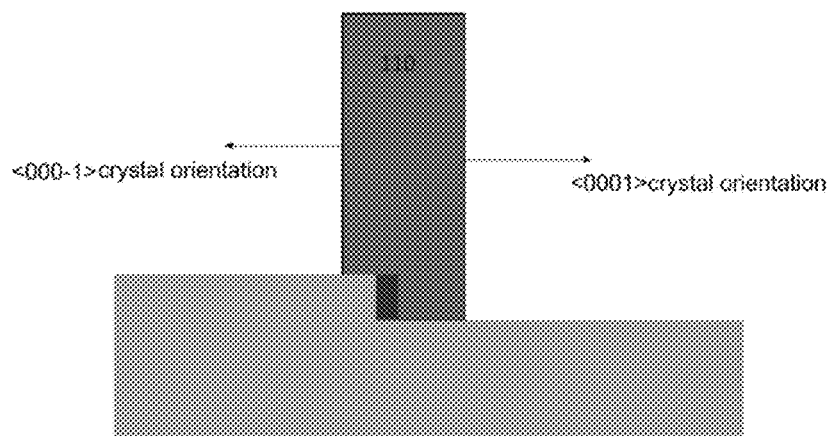

Step 3: as shown in FIG. 6, with the seed layer 101 serving as a core, being limited by the second plane 1002 of the substrate 100, a buffer layer 140 is grown epitaxially upwardly along the third surface of the substrate and laterally along the second plane of the substrate, and a nitride semiconductor layer 110 is then grown epitaxially laterally. It could be understood that the buffer layer is not essential, and thus, a nitride semiconductor layer 110 can also be grown epitaxially laterally with the seed layer serving as a core, as shown in FIG. 7.

Figure 8:
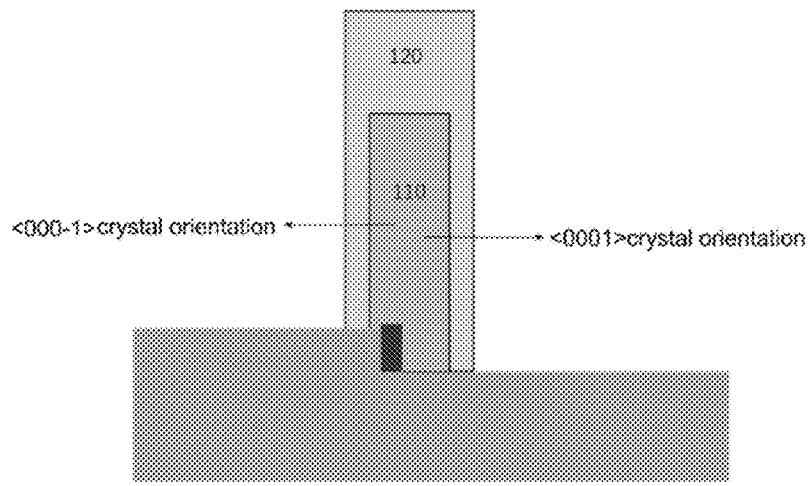

Step 4: as shown in FIG. 8, the nitride semiconductor layer 110 serves as a core, and a nitride semiconductor layer 120 is then further epitaxially grown laterally. The nitride semiconductor layer 110 and the nitride semiconductor layer 120 can be made of same or different materials. For example, N-type doping or P-type doping can be performed during the lateral epitaxial growth of the nitride semiconductor layer 110. It could be understood that description is made here by taking the case as example that a drain is subsequently formed on the nitride semiconductor layer 110, and if the source is subsequently formed at the nitride semiconductor layer 110, N-type doping or P-type doping is performed during the lateral epitaxial growth of the nitride semiconductor layer 120.

Optionally, corresponding N-doping can be performed at a portion of the nitride semiconductor layer 120, which subsequently corresponds to the regions of the device forming the first electrode and the second electrode (i.e. drain/source region); and corresponding doping can effectively reduce the contact resistance of corresponding regions.

Figure 9:
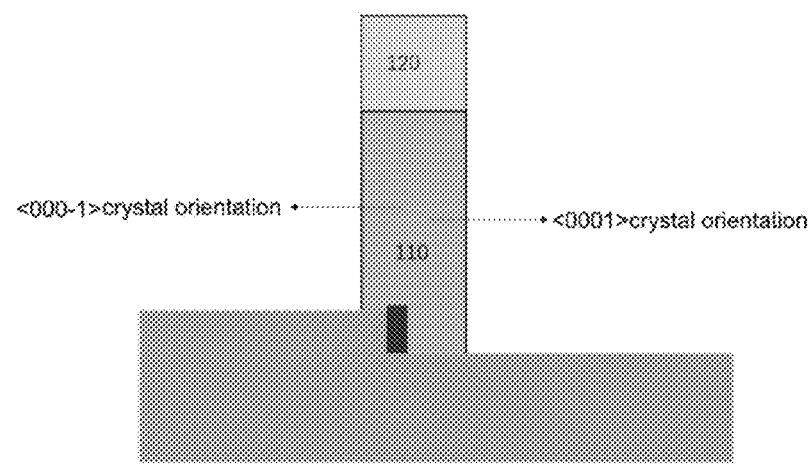
Figure 10:
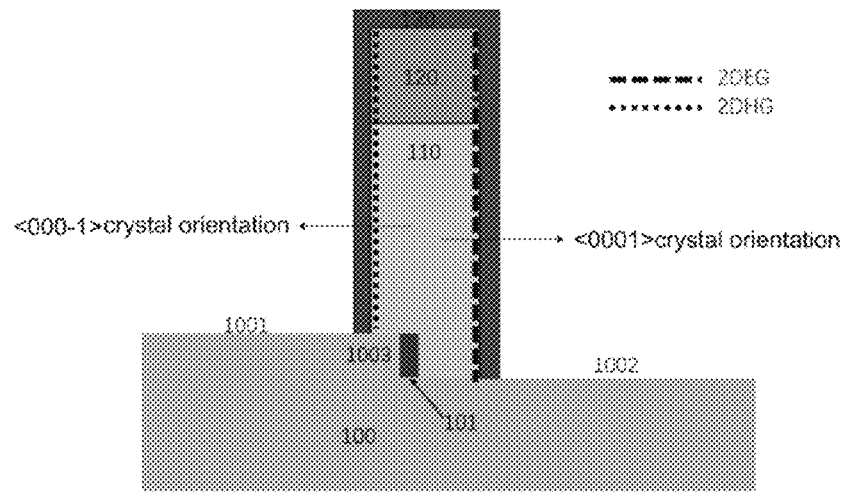

Step 5: as shown in FIG. 9, the nitride semiconductor layer 120 in <0001⁻> direction covering the nitride semiconductor layer 110 is removed, hereby exposing a (0001⁻) face of the nitride semiconductor layer 110; at the same time, the nitride semiconductor layer 120 in <0001> direction covering the nitride semiconductor layer 110 is removed, hereby exposing a (0001) face of the nitride semiconductor layer 110. Then, as shown in FIG. 10, a compound semiconductor layer 130, e.g. AlGaN, is formed on the nitride semiconductor layer 110 and the nitride semiconductor layer 120. In this case, 2DHG and immovable background negative charges are formed in the nitride semiconductor layer 110 and the nitride semiconductor layer 120 in the <0001⁻> direction at an interface with the compound semiconductor layer 130; and 2DEG and immovable background positive charges are formed in the nitride semiconductor layer 110 and the nitride semiconductor layer 120 in the <0001> direction at an interface with the compound semiconductor layer 130.

Figure 11:
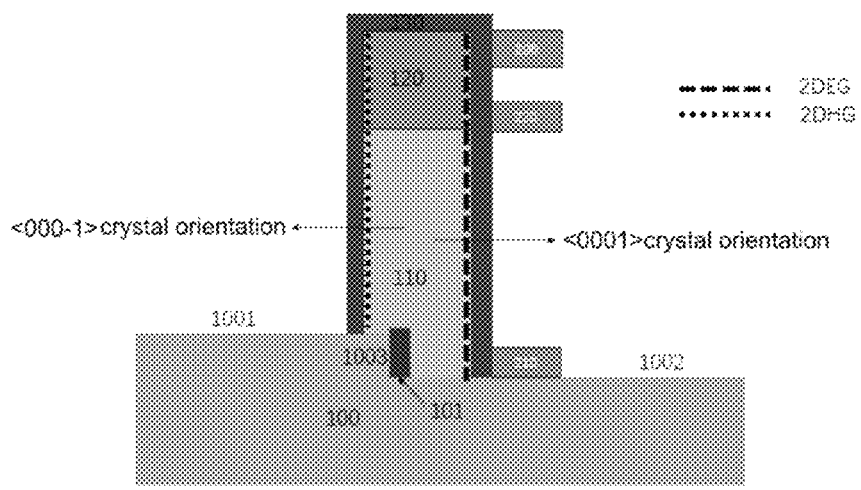

Step 6: as shown in FIG. 11, first to third electrodes of the device are formed on the nitride semiconductor layer in the <0001> direction; and no specific limitation is made regarding the positions of the first electrode 200 (source), the second electrode 210 (drain), and the third electrode 220 (gate). The first electrode and the second electrode can be in physical contact with a channel layer (110/120) of the device, and in ohmic contact with the two-dimensional electron gas (2DEG); or the first electrode and the second electrode are in physical contact directly with the compound semiconductor layer 130, hereby forming an ohmic contact. Moreover, an insulating contact or a Schottky contact can be formed on the compound semiconductor layer 130 between the third electrode and the compound semiconductor layer 130.

Figure 12:
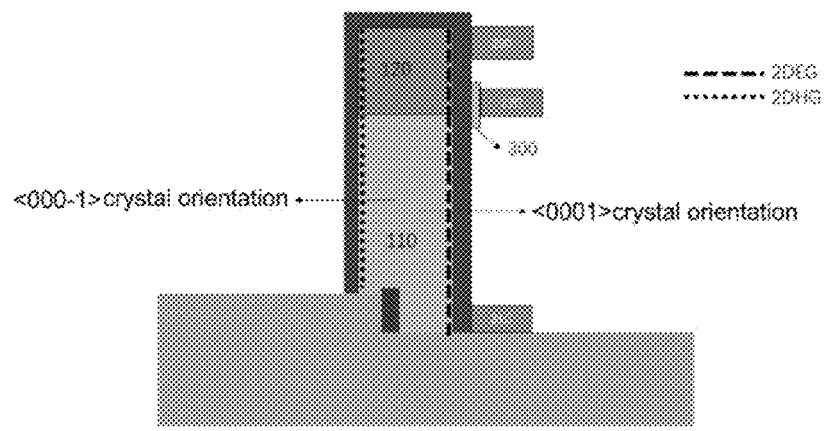

As shown in FIG. 12, an insulating layer contact refers to the formation of a gate dielectric layer 300 between the third electrode and the compound semiconductor layer 130, and a method of forming the gate dielectric layer 300 may be as follows: online in-situ growing the gate dielectric layer, after forming the compound semiconductor layer 130 in an MOCVD chamber. A method of forming the gate dielectric layer 300 may also refer to separate growth in a growing apparatus differing from that for growing the compound semiconductor layer 130. However, it should be pointed out that a gate dielectric layer online in-situ grown has a higher quality, thus, it is preferred to online in-situ grow an insulating layer.

The gate dielectric layer may be formed by silicon dioxide, SiN, a high-K-dielectric material or the like, and the gate dielectric layer 300 can achieve a surface passivation function on the compound semiconductor layer 130, which is advantageous for the reduction of the gate leakage current of the device and for the application of the device in the power electronic field. If the third electrode is formed directly on the compound semiconductor layer 130, a device fabricated in such a manner is mainly applied in a radiofrequency (RF) device, since compared with a device having a gate dielectric layer, it has greater gate leakage current.

Exemplarily, first to third electrodes can be distributed in a direction perpendicular to the first plane of the substrate 100. In the above, the second electrode is closer to the first plane 1001 of the substrate 100. The third electrode is located between the second electrode and the first electrode.

Optionally, when the source region and the drain region of an N-channel in the nitride semiconductor layer 110 and the nitride semiconductor layer 120 are N-type doped, the first electrode and the second electrode are in physical contact with the channel layer of the device, which is advantageous for the reduction of the ohmic contact resistance.

Thus, through a fin-shaped HEMT device of Group III nitride grown on the third surface and having an irregular cross-section, the integration level of the device is improved, the gate leakage current can be effectively reduced, and the preparation process is simple.

Figure 13:
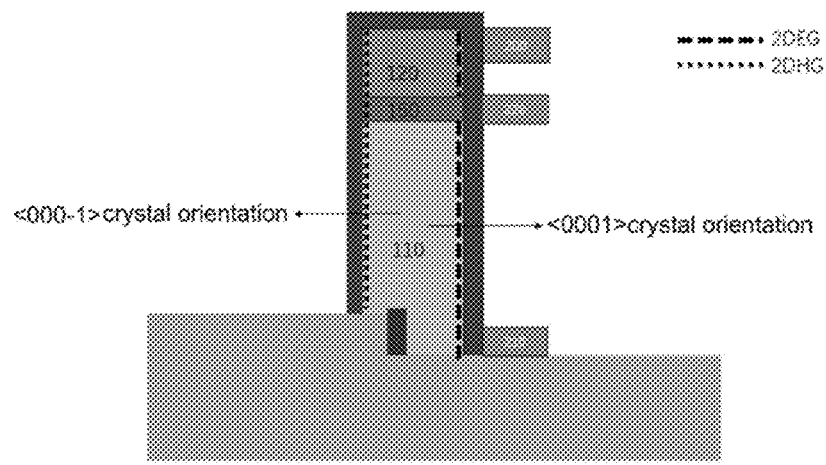
FIGS. 13-15 are schematic diagrams of an optional semiconductor device structure and a method of fabricating the same.

Optionally, as shown in FIG. 13, a P-type buried layer 150 is further provided between the nitride semiconductor layer 110 and the nitride semiconductor layer 120.

Figure 14:
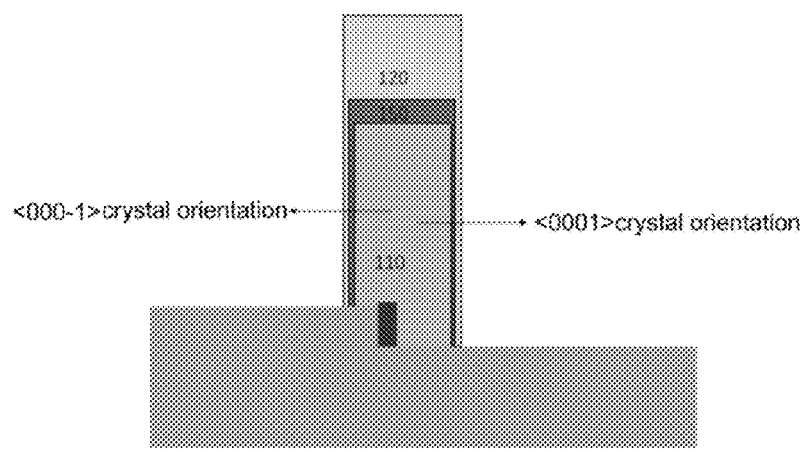

A specific method of fabricating the same is shown in FIG. 14, in step 4, a P-type buried layer, which is exemplarily a P-type GaN layer, is firstly formed by lateral epitaxial growth, after the lateral epitaxial growth of the nitride semiconductor layer 110 using AlN seed layer as a core and limited by the second plane 1002 of the substrate 100, and before the lateral epitaxial growth of a nitride semiconductor layer 120. Then, it is continued to laterally epitaxially grow a nitride semiconductor layer 120 with the buried layer serving as a core. A doping concentration for covering the P-type buried layer is for example 1E17-1E20/cm$^3$, and preferably 1E+18/cm$^3$-5E+19/cm$^3$. The P-type GaN layer can exhaust the two-dimensional electron gas in the channel layer, and accordingly make the device in a normally-closed state. It could be understood that the doping may change gradually, and no more detailed description will be made here. Optionally, the projection of the P-type buried layer in the <0001> direction falls in the projection range of the third electrode in this direction, or is partially overlapped with the projection of the third electrode in this direction. Setting of the P-type buried layer, such as the doping concentration, dimension parameters thereof or the like, may be configured according to the device parameters, so as to meet the requirement regarding exhausting 95%-100% of the two-dimensional electron gas above, and with the concentration of the two-dimensional electron gas getting higher, corresponding doping concentration can also be increased.

Figure 15:
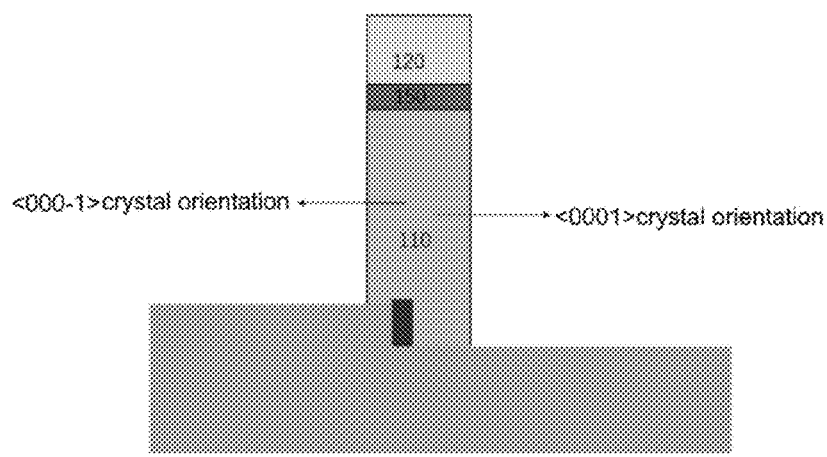

Then, as shown in FIG. 15, the nitride semiconductor layer 120 and the buried layer in the <0001> direction covering the nitride semiconductor layer 110 are removed, hereby exposing the (0001) face of the nitride semiconductor layer 110; at the same time, the nitride semiconductor layer 120 and the buried layer in the <0001$^-$> direction covering the nitride semiconductor layer 110 are removed, hereby exposing the (0001$^-$) face of the nitride semiconductor layer 110.

It could be understood that the P-type GaN layer and the two-dimensional electron gas channel also simultaneously realize the structure of a body diode, while the P-type GaN layer is formed.

While enabling the device to be in a normally-closed state, the P-type GaN layer can simultaneously form a PN structure fabricated in the device structure together with the two-dimensional electron gas channel, wherein the two-dimensional electron gas constitutes the "N" part in this PN structure. This PN structure may be applied to various electric circuits through connections of the electrodes.

Exemplarily, in electric circuit applications, the PN structure can conduct a current opposite to the HEMT current direction, hereby enriching the designs and the functions of electric circuits.

Figure 16:
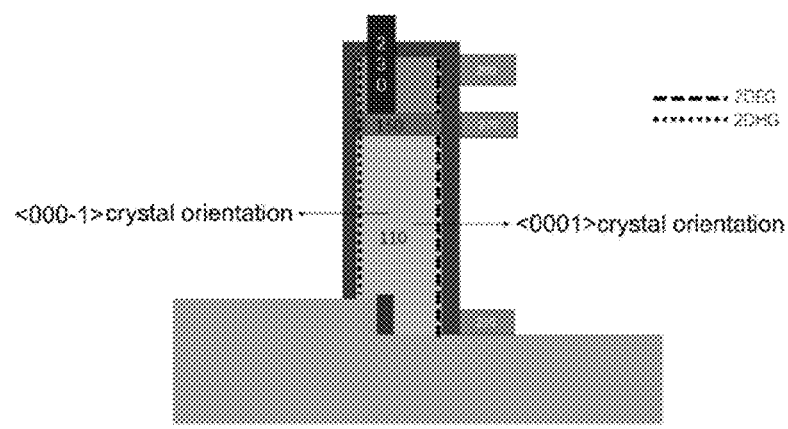
FIGS. 16-17 are schematic diagrams of an optional semiconductor device structure and a method of fabricating the same.

Optionally, a body electrode 230 is further present, which is in connection with the P-type buried layer. Exemplarily, as shown in FIG. 16, the body electrode 230 can be formed by obtaining a through hole to the P-type buried layer by way of etching the compound semiconductor layer 130 and a non-polar or semi-polar face of the nitride semiconductor layer 120, and then further filling a metal.

Figure 17:
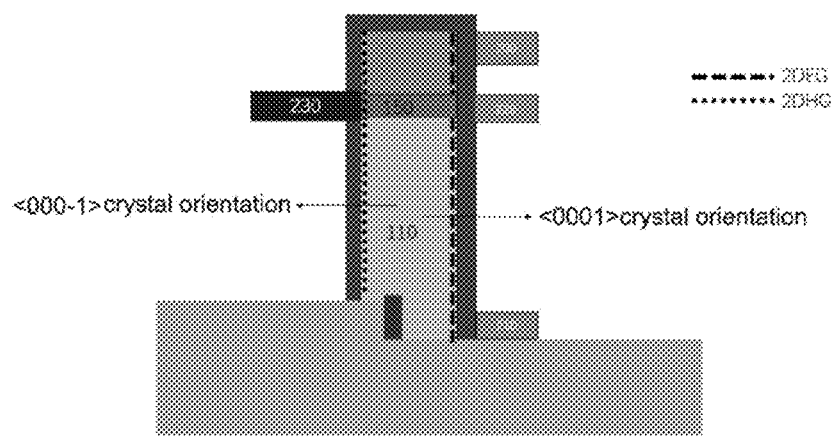

It could be understood that as shown in FIG. 17, as for a method of forming the body electrode, the compound semiconductor layer 130 in the <0001$^-$> direction covering the nitride semiconductor layer 110 may also be completely or partially removed, hereby exposing the P-type buried layer, and then the body electrode 230 is formed on the exposed P-type buried layer.

It should be clarified that in the absence of a body electrode 230, the potential of the P-type semiconductor buried layer fluctuates, which is disadvantageous for stably controlling of the threshold voltage of device.

In addition, a PN structure is formed between the P-type buried layer and the N-type GaN semiconductor layer 120, and the PN structure is able to enrich the designs and the functions of electric circuits through voltage adjustments for the second electrode (source electrode) and the body electrode.

Figure 18:
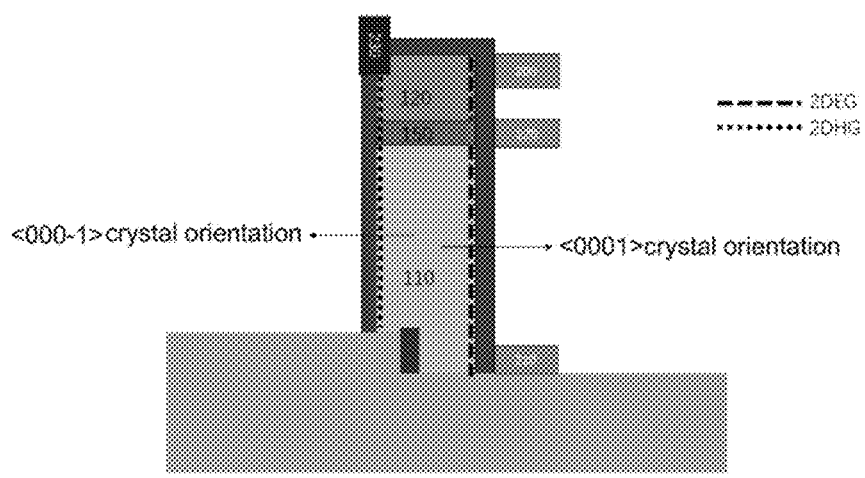
FIG. 18 is a schematic diagram of an optional semiconductor device structure and a method of fabricating the same.

Optionally, as shown in FIG. 18, a body electrode 230 is further present, and the body electrode 230 is in contact with the two-dimensional hole gas. It could be understood that the contact between the body electrode 230 and the two-dimensional hole gas is sufficient, and no further limitation is made regarding the specific position thereof. Exemplarily, the nitride semiconductor layer 120 of the (0001$^-$) face is exposed by etching the compound semiconductor layer 130 of the (0001$^-$) face, and a body electrode 230 is accordingly formed on the nitride semiconductor layer 120. Since due to the spontaneous effect and the piezoelectric effect, a two-dimensional hole gas (2DHG) is formed in the nitride semiconductor layer 110 and the nitride semiconductor layer 120 in the <0001$^-$> direction at an interface with the compound semiconductor layer 130, the body electrode is in electric connection with the P-type nitride semiconductor buried layer through the two-dimensional hole gas and controls the electric potential thereof.

It should be pointed out that in the absence of a body electrode 230, the potential of the P-type semiconductor buried layer fluctuates, which is disadvantageous for stably controlling of the threshold voltage of device; in this case, the electric potential of the P-type buried layer is controlled by means of the two-dimensional hole gas spontaneously formed in the nitride semiconductor layer and through indirect electric connection between the two-dimensional hole gas and the P-type semiconductor buried layer, and accordingly, the setting of the body electrode is enabled to be more flexible. Optionally, the PN structure mentioned above may also be applied in electric circuits through such a connection mode between the body electrode and the two-dimensional hole gas, such that the PN structure can conduct a current opposite to the HEMT current direction, and the designs and the functions of electric circuits are accordingly enriched.

Since immovable background negative charges are also present in the nitride semiconductor layer during the spontaneous formation of the two-dimensional hole gas, the background negative charges attract the two-dimensional hole gas, such that as for the body electrode, under a high voltage, during the shutting-down process of the device due to the drain electrode, 2DEG is exhausted, while background positive charges are reserved, and entire or partial 2DHG between the gate and the drain is also exhausted by the connection between the body electrode and 2DHG because of the effect of electric field, and the background negative charges are accordingly exposed. The background negative charges can partially counteract the electric field generated by the background positive charges and improve the voltage endurance capability of the device.

Figure 19:
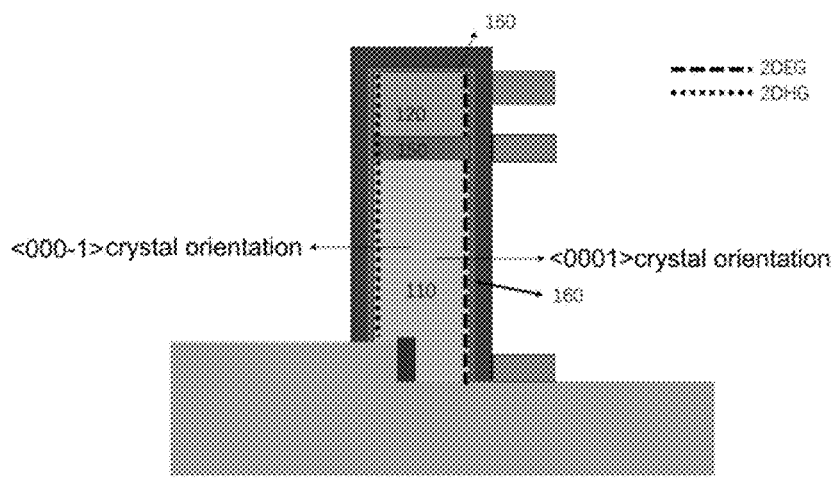
FIGS. 19-21 are schematic diagrams of an optional semiconductor device structure and a method of fabricating the same.
Figure 20:
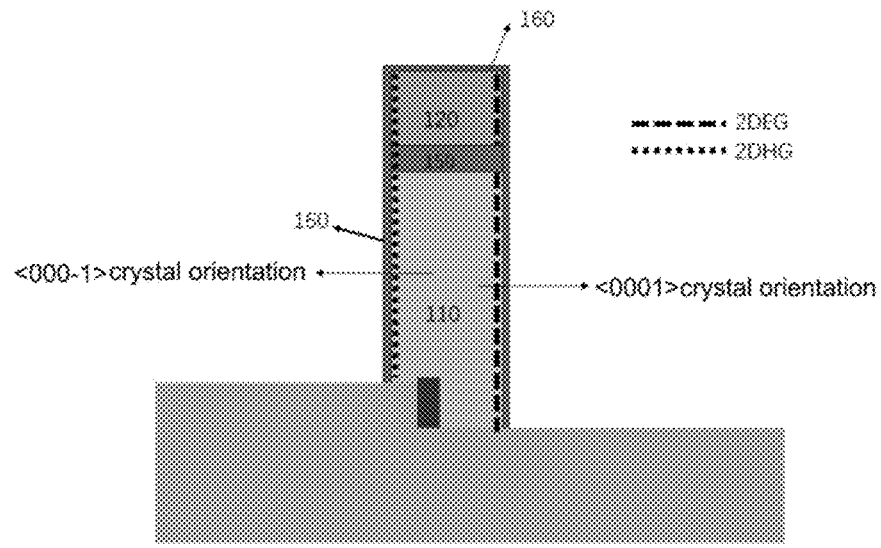
Figure 21:
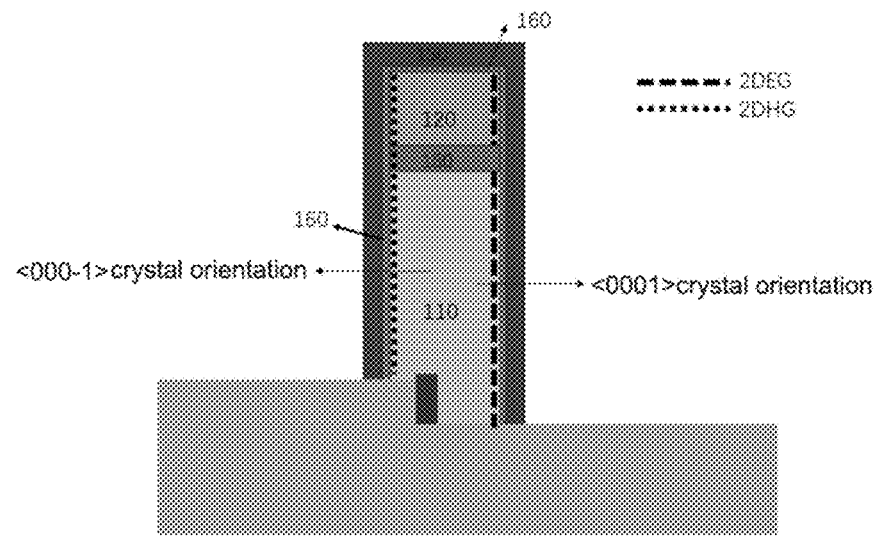

Optionally, before forming a compound semiconductor layer 130 on the nitride semiconductor layer 110, on the buried layer, and on the nitride semiconductor layer 120, a compound semiconductor layer 160 is also formed. As shown in FIGS. 19-21, a fabrication method thereof may be as follows: firstly forming a compound semiconductor layer 160 through deposition, before forming a compound semiconductor layer 130 through deposition in above Step 5. The compound semiconductor layer 160 may be made of lightly doped or unintendedly doped GaN. While the buried layer 130 exhausts 95-100% 2DEG at corresponding channel, the resistance when conducting the device will be significantly improved because of effects such as ion scattering; when the compound semiconductor layer 160 is made of lightly doped or unintendedly doped GaN, the arrangement of the compound semiconductor layer 160 can significantly reduce the ion scattering effect brought by the P-type semiconductor buried layer, and accordingly reduce the on-resistance of the device.

In addition, the decrease of electronic mobility caused by ion scattering can be reduced by providing the compound semiconductor layer 160; moreover, by adopting a material with a lower forbidden band width for the nitride semiconductor layer 110 and the nitride semiconductor layer 120, a greater difference in forbidden band width between the nitride semiconductor layer 110 and the nitride semiconductor layer 120 and the compound semiconductor layer 130 can be obtained. Moreover, the compound semiconductor layer 160 is formed before the growth of the compound semiconductor layer 130, which causes a small change in the technological process. Exemplarily, the compound semiconductor layer 160 can be made of InGaN, AlInGaN, AlInN, or AlN.

Figure 22:
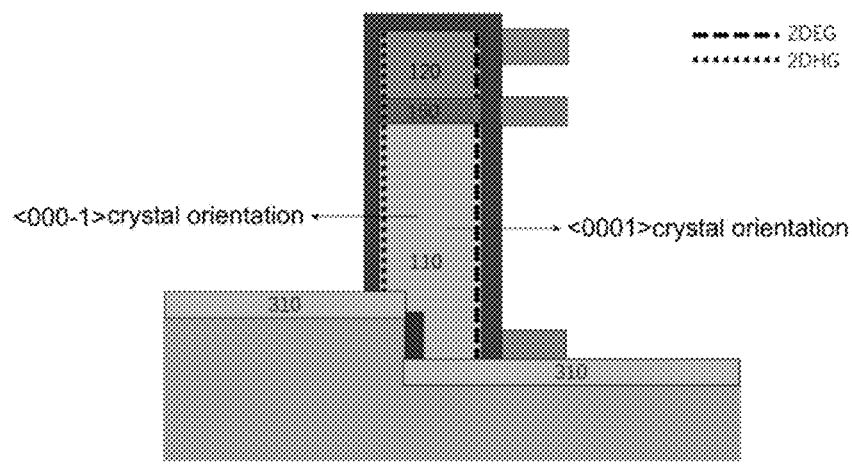
FIGS. 22-25 are schematic diagrams of an optional semiconductor device structure and a method of fabricating the same.

Optionally, an insulating layer 310, as shown in FIG. 22, is formed on other surfaces of the substrate except the third surface 1003. Optionally, the insulating layer entirely cover other surfaces.

It should be pointed out that when the substrate is a Si substrate, the third surface 1003 of the substrate can be a (111) face or a (1$^-$1$^-$1$^-$) face of the Si substrate, since the (111) face and the (1$^-$1$^-$1$^-$) face of the Si substrate have no property difference. The Si substrate may be a Si substrate employing a (110) face or a (112) face. By providing an insulating layer, the melt-back effect of Ga atoms on the Si substrate during growing can be prevented. In addition, because the selected area growth of the seed layer, e.g. AlN, is very difficult, that is to say, beside growing and forming monocrystalline AlN on the third surface of silicon, it is also easy to grow amorphous or polycrystalline AlN on the insulating layer 310. These amorphous or polycrystalline AlN may possibly have adverse influences on the structure and the functions of the device, thus, the amorphous or polycrystalline AlN layer on the insulating layer 310 will be removed, while the monocrystalline AlN layer on the third surface 1003 is reserved, by etching the amorphous or polycrystalline part, or by introducing a Cl containing etchant gas, e.g. $Cl_2$ or HCL gas, during the growth, wherein the etching selectivity ratio between monocrystalline AlN and amorphous/polycrystalline AlN caused by gas is utilized. Since it is difficult to directly nucleate and grow on the insulating layer a nitride semiconductor containing a Ga material, this nitride semiconductor is enabled to achieve selective growth only on the monocrystalline AlN layer formed by the third surface.

It could be understood that the polycrystalline or amorphous AlN layer on the insulating layer 310 may also be reserved, since the polycrystalline or amorphous AlN layer is essentially an insulating layer, and it is difficult to nucleate and grow a nitride semiconductor containing a Ga material on the polycrystalline or amorphous AlN layer. Optionally, it is also possible to remove the polycrystalline or amorphous AlN layer.

It could be understood that the insulating layer as described above may also be unnecessary, if an $Al_2O_3$ or SiC substrate is used. The reason mainly lies in that Ga atoms are compatible with $Al_2O_3$ or SiC, and there is no melt-back phenomenon. It is easier to have the nitride semiconductor nucleated and grown on the third surface including a crystalline lattice structure of a hexagonal symmetry, thus, the third surface has the capability of selected area growth.

Further, it could be understood that the presence of an insulating layer enables a greater and more controllable process window of nucleation and growth on the third surface, if an $Al_2O_3$ or SiC substrate is employed. Thus, when an $Al_2O_3$ or SiC substrate is employed, it is also possible to form an insulating layer 310 on other surfaces except the third surface 1003.

Exemplarily, a method of forming an insulating layer 310 on other surfaces except the third surface 1003 is as follows.

Figure 23:
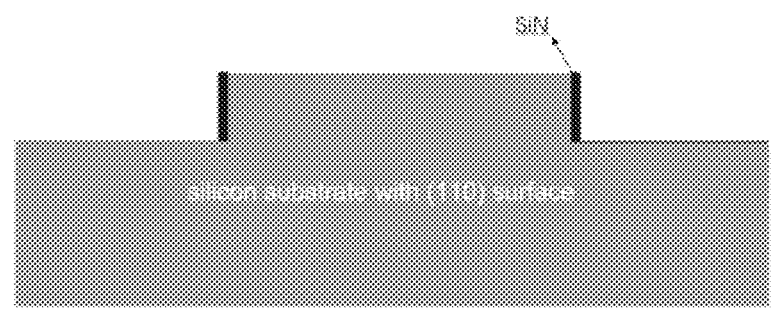
Figure 24:
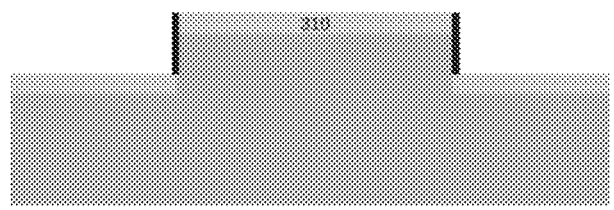
Figure 25:
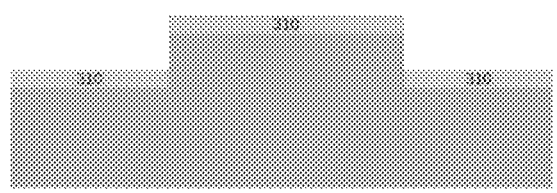
Figure 26:
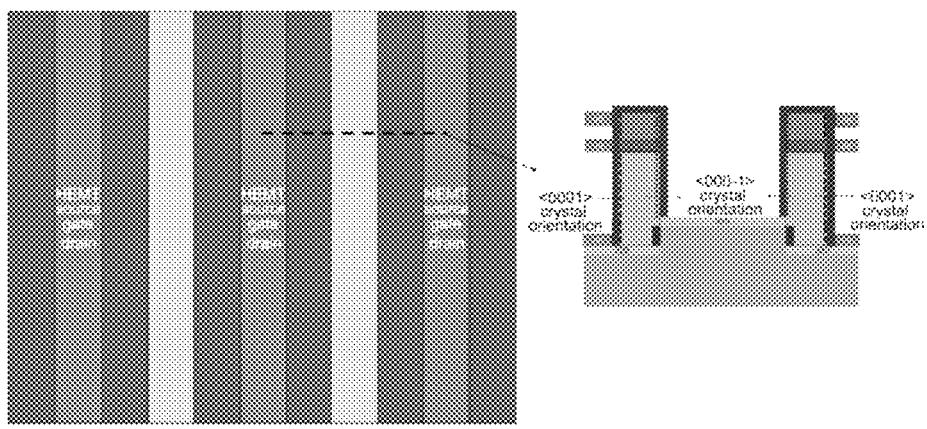
FIGS. 26-32 are schematic diagrams of an optional semiconductor device structure and a method of fabricating the same.
Figure 27:
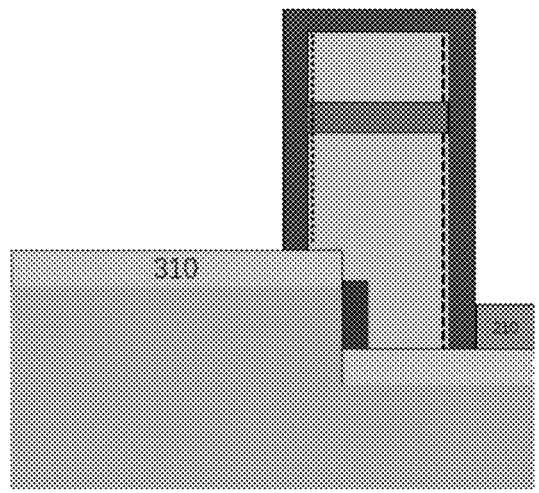
Figure 28:
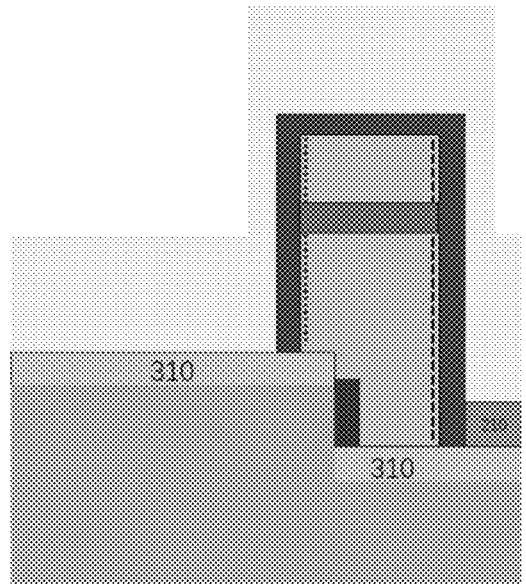
Figure 29:
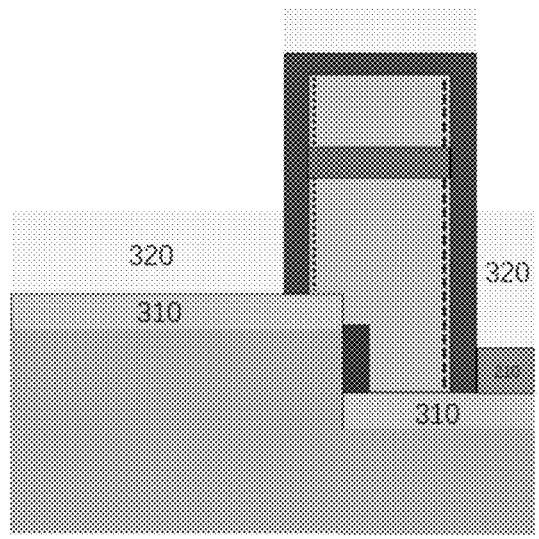
Figure 30:
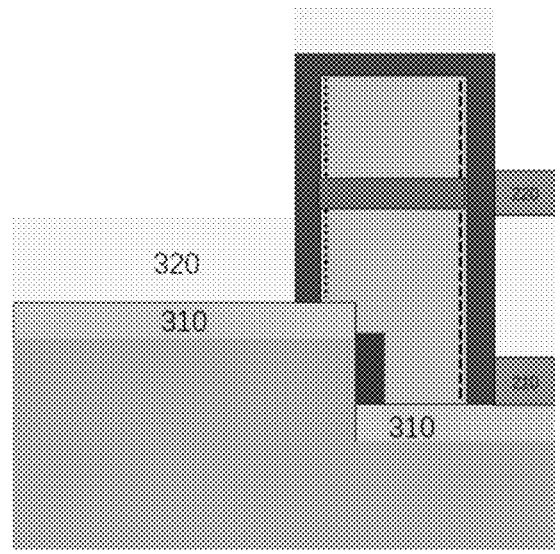
Figure 31:
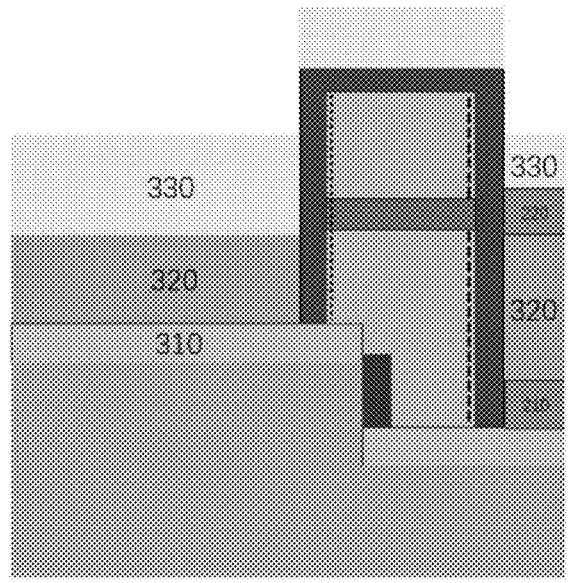
Figure 32:
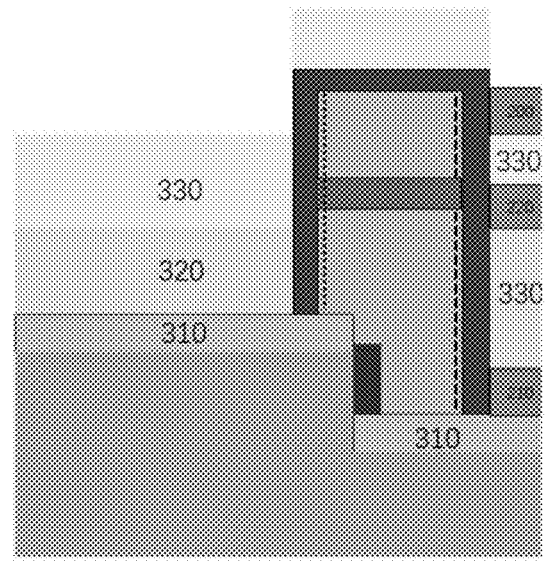

As shown in FIGS. 23-25, a boss shape is formed on the substrate through etching, and the boss has two opposite third surfaces; exemplarily, when the substrate is made of silicon, the third surface is the (111) face of silicon. Then, SiN is grown on the third surface by using technologies such as LPCVD, and only SiN on the sidewall is reserved by an etching technique of a vertical orientation. Then, $SiO_2$ is grown through an oxidation process, and because of the protection of SiN, there is no $SiO_2$ grown on the third surface, while a $SiO_2$ layer is formed on other surfaces of the silicon wafer. Subsequently, by utilizing the etching selectivity ratio between SiN and $SiO_2$, SiN on the third surface is removed by etching, while most silicon dioxide on other surfaces is reserved, through a wet etching process via hot phosphoric acid.

The design of the insulating layer can effectively avoid influences on the device performance caused by the substrate material, which is advantageous for the increase of the withstand voltage and the reduction of the dark current.

Hereinafter, a method of fabricating a source, a drain, and a gate will be exemplarily described with reference to FIGS. 26-32.

After forming an HEMT device, a relatively thick first metal layer 210 is formed on a first insulating layer 310 formed on the first plane of the substrate through a method, e.g. deposition and peeling or deposition and laser-positioning etching; beside deposition on the first insulating layer, the first metal layer is also slightly deposited on the (0001) face of the compound semiconductor layer 130 of the device; and then, the metal layer on the (0001) face of the compound semiconductor layer 130 of the device is removed through isotropic etching. Then, a second insulating layer 320 is formed on the first metal layer through coplanar deposition, the height of the second insulating layer is set at the gate region of the device by CMP in combination with etching back or accurate control over the growth thickness of the second insulating layer 320, and the compound semiconductor layer 130 or the gate dielectric layer at the gate region is exposed. Then, similar to the method of forming the first metal layer, a second metal layer 220 is formed on the second insulating layer; likewise, beside deposition on the second insulating layer, the second metal layer is also slightly deposited on the (0001) face of the compound semiconductor layer 130 of the device; and then, the metal layer on the (0001) face of the compound semiconductor layer 130 of the device is removed through isotropic etching. Subsequently, it is continued to form a third insulating layer 330 on the second metal layer through coplanar deposition, the height of the third insulating layer is set at the source region of the device by etching back or accurately controlling the growth thickness of the third insulating layer, and the compound semiconductor layer 130 or the nitride semiconductor layer 120 at the source region is exposed. Then, similarly, a third metal layer 200 is formed on the third insulating layer, and a first electrode 200 is then formed through photoetching etching. Accordingly, as shown in the figures, a gate, a source, and a drain are simultaneously formed between two devices.

It could be understood that the positions of the first electrode and the second electrode are exchangeable, and the first electrode and the second electrode can form an ohmic contact with the two-dimensional electron gas through a step of annealing or the like. The third electrode forms a Schottky contact with the compound semiconductor layer 130, or is isolated from the compound semiconductor layer 130 by the gate dielectric.

As described above, a Group III nitride semiconductor channel layer and a compound semiconductor layer 130 are grown on the above specific surface of the above substrate, for example, a GaN material or an AlGaN material has Ga-polarity or N-polarity, that is, has a <0001> or <0001⁻> orientation, when the surface thereof is the (0001) face or (0001⁻) face. In this case, 2DEG exists in the channel layer in the <0001> direction adjacent to an interface between the channel layer and the compound semiconductor layer 130, and 2DHG exists in the channel layer in the <000-1> direction adjacent to an interface between the channel layer and the compound semiconductor layer 130.

Figure 33:
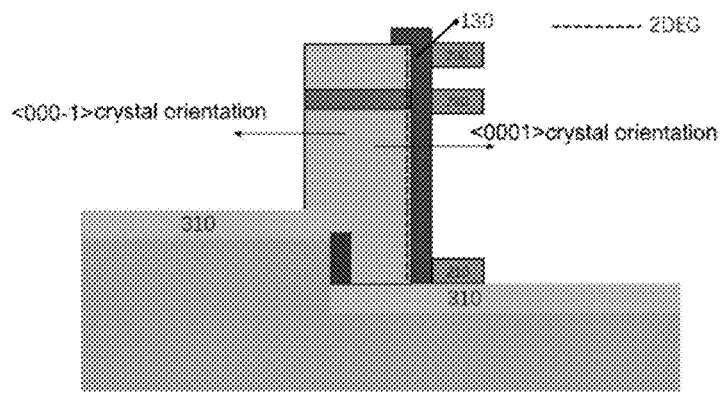
FIGS. 33-34 are schematic diagrams of an optional semiconductor device structure and a method of fabricating the same.
Figure 34:
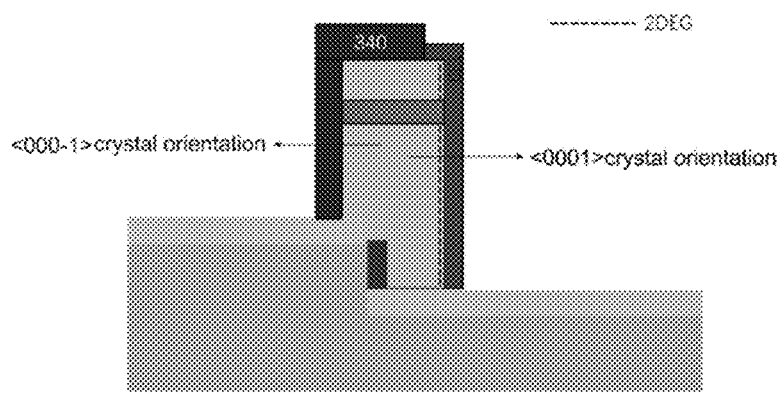

Optionally, as shown in FIG. 33, no two-dimensional electron gas 2DHG can be formed any longer in the <0001⁻> direction, after that the compound semiconductor layer 130 in the <000-1> direction is removed. Alternatively, as shown in FIG. 34, a fourth insulating layer 340 is formed on the (0001⁻) face of the Group III nitride semiconductor channel layer so as to protect the (0001⁻) face of the channel layer. It could be understood that as protective insulating layer, the fourth insulating layer 340 can extend to a non-polar face of the Group III nitride semiconductor channel layer, which is parallel to the first plane and the second plane of the substrate.

The presence of the two-dimensional electron gas 2DHG would generate a response to potential changes of the source, the drain, and the gate, and accordingly increase the parasitic capacitance and the leakage path.

Figure 35:
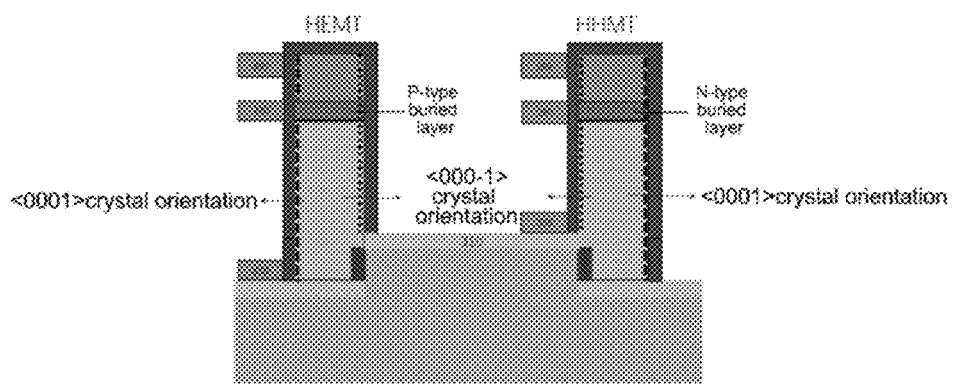

Optionally, as shown in FIG. 35, a Group III nitride device comprises a plurality of electron-channel Group III nitride devices as described above, and comprises a plurality of hole-channel Group III nitride devices. In the above, the hole-channel Group III nitride devices and the electron-channel Group III nitride devices are arranged in correspondence with each other.

It could be understood that in correspondence with the electron-channel Group III nitride device, a fourth electrode 240, a fifth electrode 250, and a sixth electrode 260 are formed on the nitride semiconductor layer 110 and the nitride semiconductor layer 120 in the <0001⁻> direction. No specific limitation is made regarding the positions of the fourth to sixth electrodes. In this case, the fourth electrode may be the source of the hole-channel device, the fifth electrode may be the drain of the hole-channel device, and the sixth electrode may be the gate of the hole-channel device. The fourth electrode and the fifth electrode can respectively be in physical contact with the channel layer (110/120) of the device, and in ohmic contact with the two-dimensional hole gas; or the fourth electrode and the fifth electrode are in physical contact directly with the compound semiconductor layer 130, hereby forming an ohmic contact. An insulating contact or a Schottky contact is respectively formed on the compound semiconductor layer 130 between the sixth electrode 260 and the compound semiconductor layer 130. In the above, an insulating layer contact refers to the formation of a gate dielectric layer 300 between the sixth electrode 260 and the compound semiconductor layer 130; the gate dielectric layer may be made of SiO₂, a high-K-dielectric material or the like; the gate dielectric layer 300 can achieve a surface passivation function on the compound semiconductor layer 130, which is advantageous for the reduction of the gate leakage current of the device and for the application of the device in the power electronic field; and if the gate dielectric layer is directly fabricated on the compound semiconductor layer 130, a relatively great gate leakage current would be generated, and a device fabricated in such a manner is mainly applied in the radiofrequency (RF) field.

Exemplarily, the fourth to sixth electrodes can be distributed in a direction perpendicular to the first plane of the substrate 100. In the above, the fifth electrode is closer to the first plane 1001 of the substrate 100. It could be understood that the fourth electrode may also be closer to the first plane 1001 of the substrate 100. The sixth electrode is located between the fifth electrode and the fourth electrode.

It could be understood that in correspondence with the electron-channel Group III nitride device, the hole-channel Group III nitride device is correspondingly P-type doped at a portion in the nitride semiconductor layer 110 and in the nitride semiconductor layer 120 corresponding to the source/drain regions of the device. This is advantageous for reducing the ohmic contact resistance.

It could be understood that in correspondence with the electron-channel Group III nitride device, there is an N-type buried layer in the hole-channel. Further, it could be understood that one of the P-type doped regions could be enabled by a corresponding design to coincide with the N-type buried layer in the electron-channel Group III nitride device. Alternatively, the electron-channel Group III nitride device is enabled to be correspondingly N-type doped at a portion in the nitride semiconductor layer 110 and in the nitride semiconductor layer 120 corresponding to the source/drain regions of the device, so as to coincide with the N-type buried layer in the hole-channel Group III nitride device.

It could be understood that as shown in FIG. 36, a P-type buried layer and an N-type buried layer can be present simultaneously in the nitride semiconductor layer, and if an electron-channel Group III nitride device is to be formed, the gate is formed at the P-type buried layer; and if a hole-channel Group III nitride device is to be formed, the gate is formed at the N-type buried layer.

Other structures of the electron-channel Group III nitride devices and the hole-channel Group III nitride devices are similar, and no more detailed description will be made here.

By providing electrodes on corresponding polarization faces on a fin-shaped Group III nitride device having an irregular cross-section, an HHMT device and an HEMT device can be simultaneously formed, wherein the integration level of the device is improved, the gate leakage current can be effectively reduced, and the preparation process is simple; further, a complementary device can be formed through the HHMT device and the HEMT device.

A radiofrequency electronic device, such as a personal computer, a cellphone, a digital camera or other electronic apparatuses, comprises any one of the above devices.

A power electronic device, which can be applied to a power amplifier in fields such as mobile phone base stations, optical communication systems and the like, or may be a power device, and can comprise any one of the above devices.

Solutions of the present disclosure can be at least helpful to realize one of following effects: the semiconductor device structure can reduce the gate leakage current, has a high threshold voltage, high power, and high reliability, can realize a low on-resistance and a normally-closed state of the device, and can provide a stable threshold voltage, enabling the semiconductor device to have good switching characteristics.

The solutions of the present disclosure can also be helpful to realize one of following effects: a higher channel density can be achieved in each unit area; the integration density of the device is improved; and the device has a relatively simple structure and requires a relatively simple preparing process, and the production costs can be effectively reduced.

In the above contents, the present disclosure is described in combination with specific embodiments; however, it would be clear for a person skilled in the art that the description is exemplary and cannot be deemed as limiting the scope of protection of the present disclosure. A person skilled in the art could make various variations and modifications to the present disclosure according to the spirit and the principle of the present disclosure, and these variations and modifications fall also within the scope of the present disclosure.

INDUSTRIAL APPLICABILITY

A semiconductor device is proposed, which requires a simple process, requires low costs, achieves a higher channel density per unit area, can simultaneously have an electron-channel and a hole-channel, has high performance such as high withstand voltage, high power and low on-resistance, and is energy saving.

What is claimed is:

1. A method for fabricating a fin-shaped electron-channel semiconductor device, comprising:
   providing a substrate and etching a stepped structure on an upper surface thereof, wherein the stepped structure has a first plane and a second plane, which are substantially parallel to each other, and a third surface respectively connecting the first plane and the second plane, and the third surface has a crystalline lattice of a hexagonal symmetry;
   laterally epitaxially growing, which is restricted by the second plane, a fin-shaped nitride semiconductor layer upwardly and perpendicularly to the second plane, by using the third surface as a core; and
   forming a first compound semiconductor layer on the nitride semiconductor layer, so as to simultaneously form, at an interface between the first compound semiconductor layer and the nitride semiconductor layer, a two-dimensional hole gas and immovable background negative charges; and/or a two-dimensional electron gas and immovable background positive charges.

2. The method according to claim 1, further comprising: forming a seed layer on the third surface, wherein the seed layer is formed on partial surface of the third surface, or formed on entire surface of the third surface.

3. The method according to claim 2, further comprising: laterally epitaxially growing a buffer layer with the seed layer as a core.

4. The method according to claim 3, further comprising: laterally epitaxially growing a P-type buried layer with the nitride semiconductor layer as a core, and then continuing to laterally epitaxially grow a nitride semiconductor layer with the buried layer as a core.

5. The method according to claim 1, further comprising: laterally epitaxially growing a P-type buried layer with the nitride semiconductor layer as a core, and then continuing to laterally epitaxially grow a nitride semiconductor layer with the buried layer as a core.

6. The method according to claim 5, further comprising: forming a body electrode in connection with the buried layer.

7. The method according to claim 2, further comprising: laterally epitaxially growing a P-type buried layer with the nitride semiconductor layer as a core, and then continuing to laterally epitaxially grow a nitride semiconductor layer with the buried layer as a core.

8. A fin-shaped electron-channel semiconductor device, comprising:
   a substrate, on which a stepped structure is formed, wherein the stepped structure has a first plane and a second plane, which are substantially parallel to each other, and a third surface respectively connecting the first plane and the second plane, wherein the third surface has a crystalline lattice of a hexagonal symmetry;
   a fin-shaped nitride semiconductor layer, limited by the second plane and perpendicular to the second plane, wherein the fin-shaped nitride semiconductor layer is upwardly laterally epitaxially grown by using the third surface as a core; and
   a first compound semiconductor layer formed on the nitride semiconductor layer, so as to simultaneously form a two-dimensional electron gas and/or a two-dimensional hole gas at an interface between the first compound semiconductor layer and the nitride semiconductor layer.

9. The fin-shaped electron-channel semiconductor device according to claim 8, further comprising: a P-type buried layer formed in a middle of the nitride semiconductor layer.

10. The fin-shaped electron-channel semiconductor device according to claim 9, further comprising: a body electrode in connection with the buried layer.

11. The fin-shaped electron-channel semiconductor device according to claim 10, wherein the substrate is selected from $Al_2O_3$, intrinsic GaN, 4H—SiC, silicon of a (110) face, or silicon of a (112) face.

12. The fin-shaped electron-channel semiconductor device according to claim 9, wherein the substrate is selected from $Al_2O_3$, intrinsic GaN, 4H—SiC, silicon of a (110) face, or silicon of a (112) face.

13. The fin-shaped electron-channel semiconductor device according to claim 6, wherein the substrate is selected from $Al_2O_3$, intrinsic GaN, 4H—SiC, silicon of a (110) face, or silicon of a (112) face.

14. A fin-shaped electron-channel semiconductor device, comprising:
   a substrate;
   a fin-shaped nitride semiconductor layer epitaxially grown perpendicular to an upper surface of the substrate, wherein the fin-shaped nitride semiconductor layer comprises a first nitride semiconductor layer and a second nitride semiconductor layer; and
   a first compound semiconductor layer formed on the fin-shaped nitride semiconductor layer, so as to simultaneously form a two-dimensional hole gas and/or a two-dimensional electron gas at an interface between the first compound semiconductor layer and the fin-shaped nitride semiconductor layer,
   wherein a P-type buried layer is sandwiched between the first nitride semiconductor layer and the second nitride semiconductor layer.

15. The device according to claim 14, wherein a body diode structure is formed from a channel of the two-dimensional electron gas and the P-type buried layer.

* * * * *